United States Patent
Kim et al.

(10) Patent No.: US 9,966,904 B2
(45) Date of Patent: May 8, 2018

(54) RF AMPLIFIER TO INCREASE GAIN USING TRANSFORMER

(71) Applicant: Korea Electronics Technology Institute, Seongnam-si, Gyeonggi-do (KR)

(72) Inventors: Ki Jin Kim, Yongin-si (KR); Kwang Ho Ahan, Yongin-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days. days.

(21) Appl. No.: 15/391,500

(22) Filed: Dec. 27, 2016

(65) Prior Publication Data
US 2017/0237402 A1    Aug. 17, 2017

(30) Foreign Application Priority Data
Feb. 17, 2016 (KR) .......................... 10-2016-0018200

(51) Int. Cl.
*H03F 1/22* (2006.01)
*H03F 3/193* (2006.01)
*H03F 1/34* (2006.01)

(52) U.S. Cl.
CPC ............. *H03F 1/223* (2013.01); *H03F 1/347* (2013.01); *H03F 3/193* (2013.01); *H03F 2200/405* (2013.01); *H03F 2200/451* (2013.01); *H03F 2200/537* (2013.01)

(58) Field of Classification Search
CPC .................................. H03F 1/22; H03F 3/2176
USPC ................................................... 330/311, 310
See application file for complete search history.

(56) References Cited

U.S. PATENT DOCUMENTS 7,737,788 B1 *  6/2010  Roo .......................... H03F 1/22
                                              330/253
8,558,619 B2 * 10/2013  Mohammadi ........... H03F 3/426
                                              330/277
8,803,614 B2 *  8/2014  Giammello ........... H03F 3/4508
                                              330/302

FOREIGN PATENT DOCUMENTS

KR       20110048308 A     5/2011
KR        101326442 B1    11/2013

OTHER PUBLICATIONS

Korean Office Action dated Jan. 26, 2017 in connection with the counterpart Korean Patent Application No. 10-2016-0018200.

* cited by examiner

*Primary Examiner* — Henry Choe
(74) *Attorney, Agent, or Firm* — Hauptman Ham, LLP

(57) ABSTRACT

An RF amplifier to increase a gain using a transformer is provided. The amplifier includes: a first transistor configured to generate a current by amplifying and converting an input voltage; a second transistor configured to amplify the generated current; and a first transformer configured to feed an emitter current of the second transistor back to a gate. Accordingly, $G_m$ of the transistor is boosted using the transformer, such that a high gain can be obtained with a low current. Therefore, a problem of a gain reduction caused by a parasitic capacitor at a high frequency can be solved.

7 Claims, 9 Drawing Sheets

RF AMPLIFIER TO INCREASE GAIN USING TRANSFORMER

CROSS-REFERENCE TO RELATED APPLICATION(S) AND CLAIM OF PRIORITY

The present application claims the benefit under 35 U.S.C. § 119(a) to a Korean patent application filed in the Korean Intellectual Property Office on Feb. 17, 2016, and assigned Ser. No. 10-2016-0018200, the entire disclosure of which is hereby incorporated by reference.

TECHNICAL FIELD OF THE INVENTION

The present invention relates generally to a radio frequency (RF) amplifier, and more particularly, to an RF amplifier which is used in a front-end module for wireless communication such as mobile communication, WiFi, or the like.

BACKGROUND OF THE INVENTION

FIG. 1 is a view showing a structure of a related-art RF cascode amplifier. The RF amplifier is a block which is made to minimize a noise while amplifying a minute signal, and is core to RF circuit technology.

The RF rectifier is a block which provides a power gain and should match input/output each other. Therefore, it is common that impedance matching inductors Lg and Ls are used as shown in FIG. 1.

In the case of a complementary metal oxide semiconductor (CMOS), a gate is formed of a pure capacitor. Therefore, it is difficult to match the CMOS with an antenna having real impedance. To solve this, Ls is inserted. The inserted Ls serves to provide real impedance as indicated by Equation 1 presented below:

$$Z_{in}(s) = sL_g + sL_S + \frac{1}{sC_{gs1}} + g_{m1}\frac{L_s}{C_{gs}} \quad \text{Equation 1}$$

In addition, as shown in Equation 1, Lg is an inductor which is inserted for impedance matching.

A small signal equivalent circuit of FIG. 1 is illustrated in FIG. 2. As can be seen from FIG. 2, the RF cascode amplifier has a structure in which a current source trans-impedance amplified and converted at M1 is current-amplified at M2 again, such that two-stage amplification is performed and an amplification gain is maximized.

The RF cascode amplifier having the above-described structure ideally operates at a frequency of 10 GHz or less, but, in a high frequency band in which Cp, which is a parasitic capacitor, relatively increases, a current signal trans-impedance amplified and converted at M1 may be lost.

In addition, as shown in FIG. 3, the structure of the related-art RF cascode amplifier has a problem that a noise characteristic deteriorates as a frequency increases.

$$\overline{i_{d2}^2} = 4KT\gamma_2 g_{do2}\Delta f \quad \text{Equation 2}$$

A gain obtained by the transistor M1 is expressed by Equation 3 presented blow:

$$A_{V1} = Gm \times \text{Load} = \frac{gm_1}{2\omega_0 C_{gs1}R_s} \times \frac{1}{\omega_0 C_p + gm_2} \quad \text{Equation 3}$$

As shown in Equation 3, the gain may be divided into a Gm part and a Load part. Since the two parts are influenced by the parasitic capacitor, the gain of the amplifier rapidly decreases as the frequency (ω) of the signal increases, and as a result, the unique characteristic of the cascode may not be utilized.

However, in the related-art RF cascode amplifier, the parasitic capacitor Cp may not be minimized due to the sizes of defined transistors.

SUMMARY OF THE INVENTION

To address the above-discussed deficiencies of the prior art, it is a primary aspect of the present invention to provide an amplifier which boosts $G_m$ of a transistor using a transformer in a cascode structure in which a current is recycled, as a method for implementing an amplifier which can obtain a high gain with low power.

According to one aspect of the present invention, an amplifier includes: a first transistor configured to generate a first current by amplifying and converting an input voltage; a second transistor configured to generate a second current by amplifying the first current; and a first transformer configured to feed an emitter current of the second transistor back to a gate.

In addition, the first transformer may be configured to boost $g_m$ of the second transistor according to $G_m$.

In addition, $G_m = 2 g_m$.

In addition, the first transformer may have a primary coil connected to an emitter of the second transistor and have a secondary coil connected to the gate of the second transistor.

In addition, the secondary coil may be configured to apply a current induced by the primary coil to the gate.

In addition, a turns ratio of the primary coil to the second coil may be 1:1.

In addition, the second transistor may be configured to output the second current through a collector, and the amplifier may further include: a third transistor configured to generate a third current by amplifying and converting a collector voltage of the second transistor generated by the second current; a fourth transistor configured to generate a fourth current by amplifying the third current; and a second transformer configured to feed an emitter current of the fourth transistor back to a gate.

According to another aspect of the present invention, a method for amplifying includes: generating, by a first transistor, a first current by amplifying and converting an input voltage; generating, by a second transistor, a second current by amplifying the first current; and feeding, by a first transformer, an emitter current of the second transistor back to a gate.

According to exemplary embodiments of the present invention described above, $G_m$ of the transistor is boosted using the transformer, such that a high gain can be obtained with a low current. Therefore, a problem of a gain reduction caused by a parasitic capacitor at a high frequency can be solved.

In particular, according to embodiments of the present invention, a high gain can be ensured using low power at a millimeter-wave frequency.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
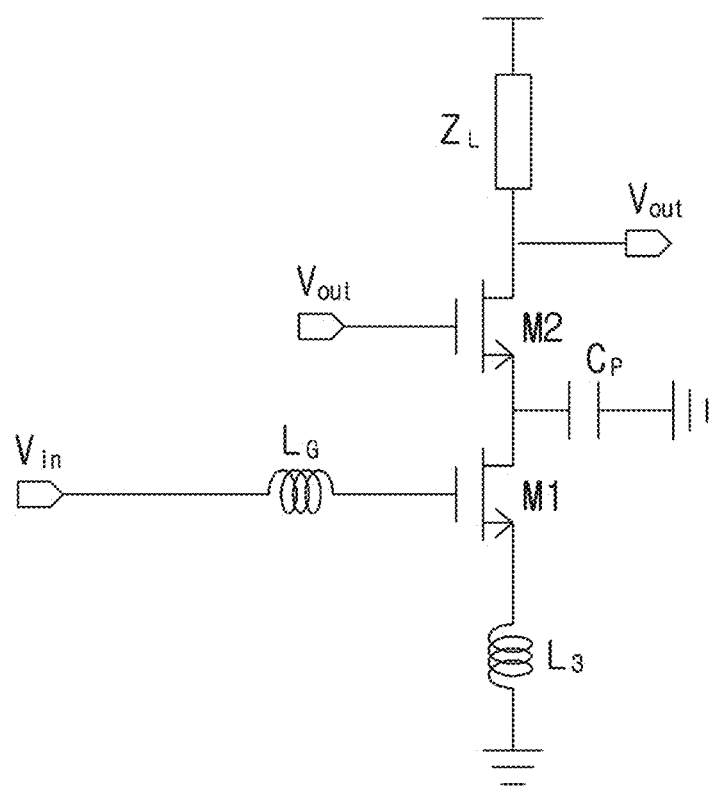
FIG. 1 is a view showing a structure of a related-art RF cascode amplifier.
Figure 2:
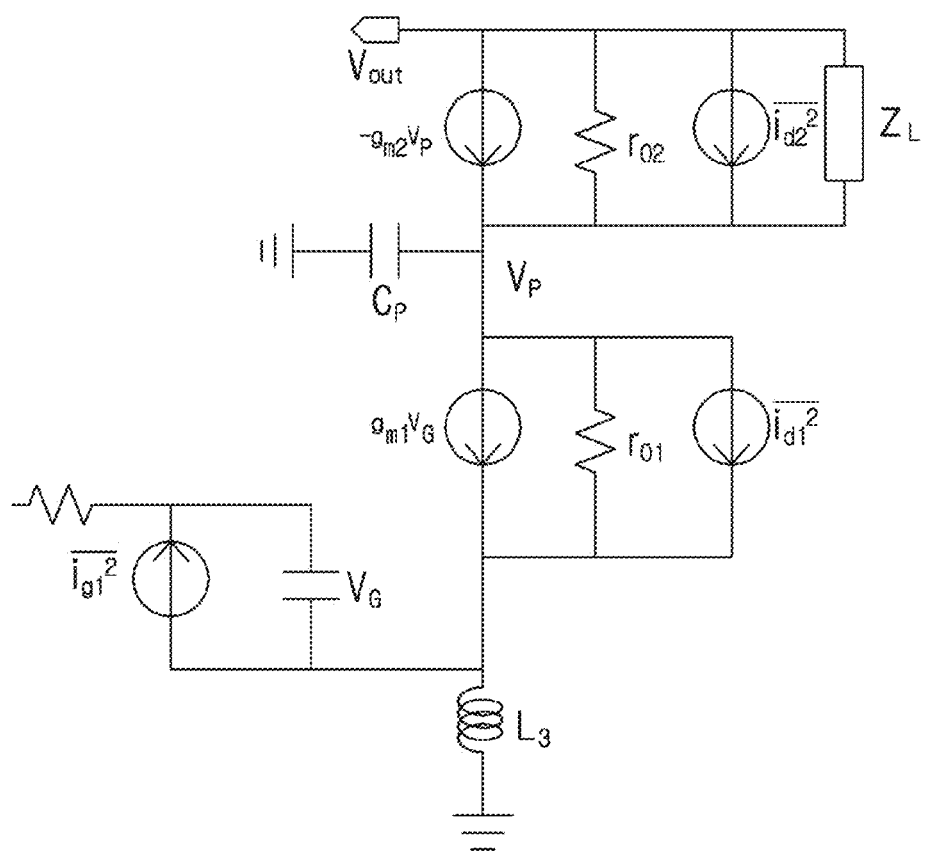
FIG. 2 is a view showing a small signal model of the related-art RF cascode amplifier.

Reference will now be made in detail to the embodiment of the present general inventive concept, examples of which are illustrated in the accompanying drawings, wherein like reference numerals refer to the like elements throughout. The embodiment is described below in order to explain the present general inventive concept by referring to the drawings.

Figure 3:
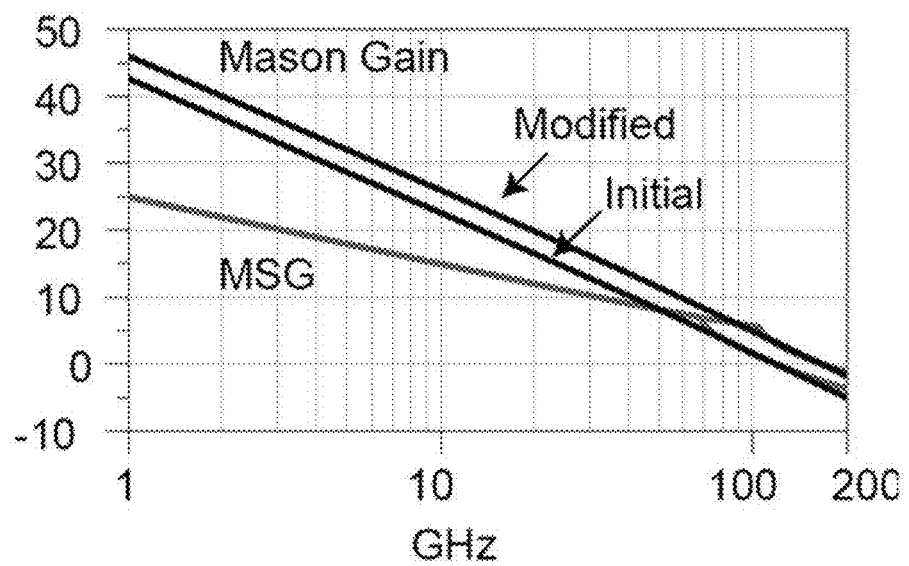
FIG. 3 is a view showing a maximum available gain (MAG) curve of a CMOS.

FIG. 3 shows a MAG curve of a CMOS. As described above based on Equation 3 presented above, as a frequency increases, a gain decreases. Therefore, it can be identified that a maximum gain which can be obtained by a single common source amplifier in a 60 GHz frequency band for IEEE 802.11ad does not reach 8 dB.

Figure 4:
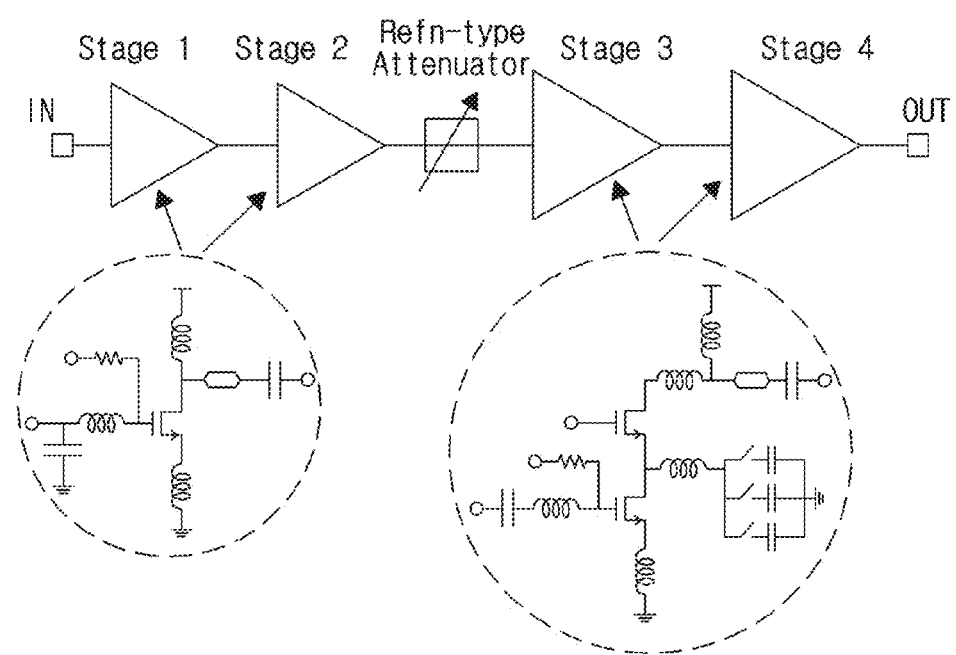
FIGS. 4 and 5 are views showing results of researches identifying a gain reduction at 60 GHZ using a CMOS 65 nm process.
Figure 5:
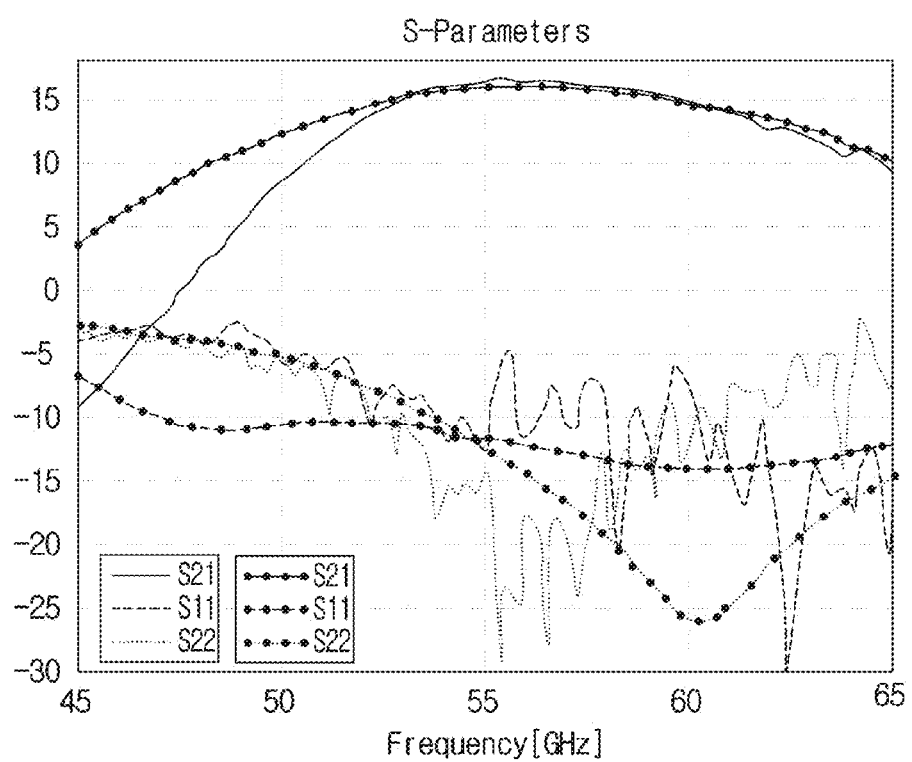

The above-described fact is found out in the result of using a CMOS 65 nm process. It can be seen from the graph of FIG. 5 that a gain which is obtained at 60 GHz using two common sources stages and two cascode stages as shown in FIG. 4 is at most 15 dB.

As indicated by Equation 3, when $G_m$ of a transistor increases, Cp, which is a parasitic capacitor, increases, such that a high frequency gain can be further reduced.

Another method of increasing $G_m$ is increasing a current. However, this method is not effective in that $G_m$ is in proportion to the square root of a current, and may be a factor which makes it difficult to design a low-power high frequency amplifier.

Figure 6:
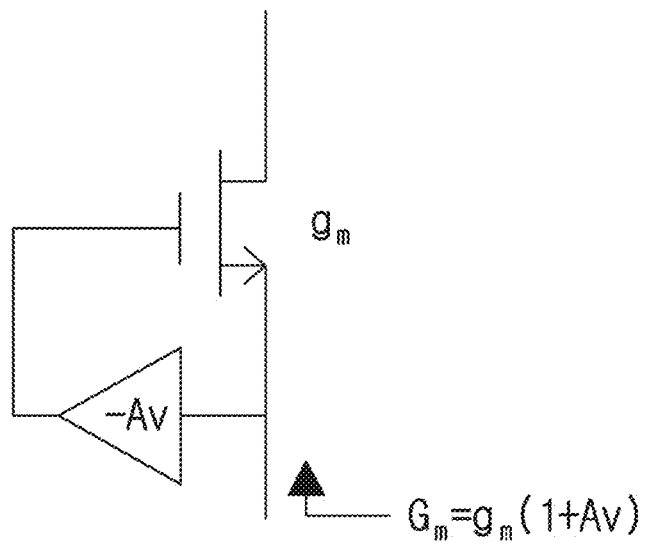
FIG. 6 is a view showing a $G_m$ boosting method according to an exemplary embodiment of the present invention.

In an embodiment of the present invention, a Gm boosting method suggested in FIG. 6 is used. FIG. 6 illustrates a method for boosting $G_m$ through feedback.

As shown in FIG. 6, it can be seen that, when an emitter current of a transistor is fed back to a gate, the gain $G_m$ of the transistor becomes $g_m(1-Av)$. Herein, $g_m$ is a unique gain of the transistor and −Av is a gain obtained by feedback.

Figure 7:
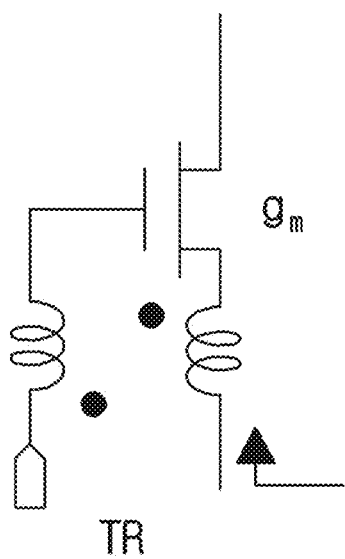
FIG. 7 is a view showing a $G_m$ boosting method using a transformer.

When Av is implemented by "−1," $G_m=2\ g_m$. FIG. 7 illustrates a method for implementing Av by "−1." In FIG. 7, Av is made to be "−1" using a reverse polarity of a transformer.

As shown in FIG. 7, a transformer TR may have a primary coil connected to a source of a transistor and may have a secondary coil connected to a gate of the transistor. A turns ratio of the primary coil of the transformer TR to the secondary coil is implemented by 1:1.

Accordingly, when a current outputted from a source of the transistor flows in the primary coil, a current is induced in the second coil and the induced current is applied to the gate of the transistor. Accordingly, $g_m$ of the transistor is boosted according to Gm=2 $g_m$.

Figure 8:
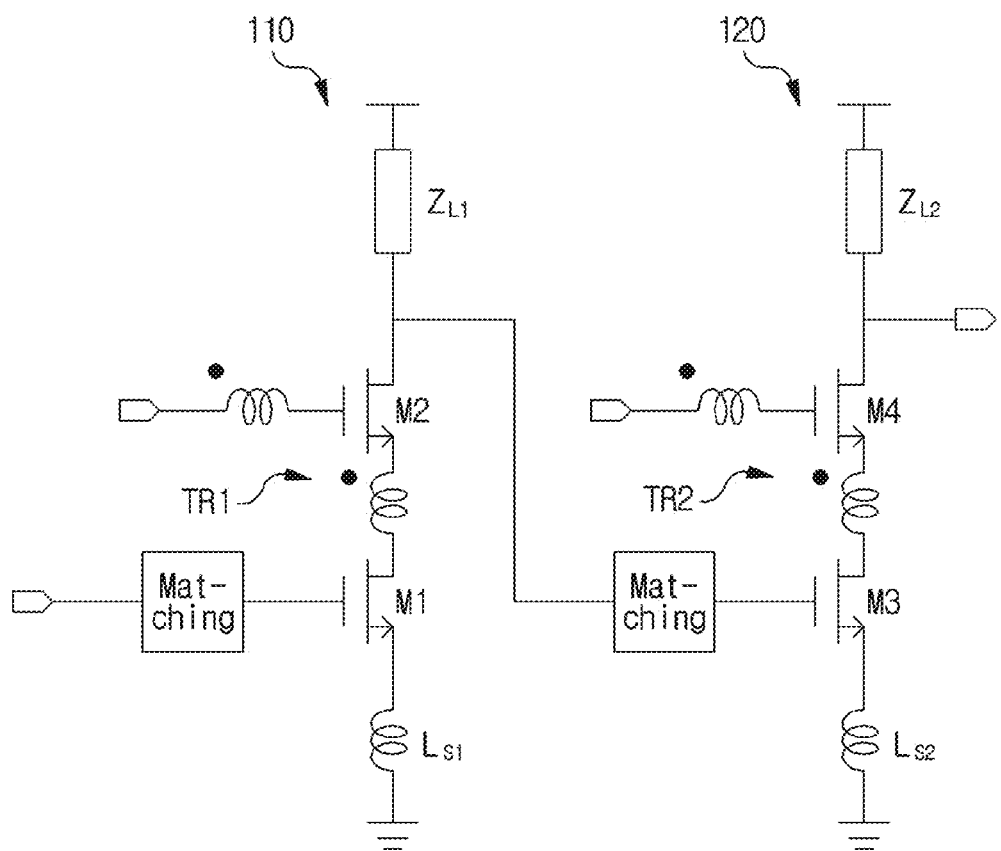
FIG. 8 is a view showing an RF cascode amplifier according to an exemplary embodiment of the present invention.

FIG. 8 is a view showing an RF cascode amplifier according to an exemplary embodiment of the present invention. As shown in FIG. 8, the RF cascode amplifier may include two RF cascode amplification modules 110 and 120.

In this structure, a current which is primarily amplified at the RF cascode amplification module-1 110 is secondarily amplified at the RF cascode amplification module-2 120.

The RF cascode amplification module-1 110 includes a transistor-1 M1, a transistor-2 M2, and a transformer-1 TR1. A collector of the transistor-1 M1 is connected to an emitter of the transistor-2 M2.

The RF cascode amplification module-1 110 has a modified cascode amplification structure in which a common source is amplified by the transistor-1 M1 and a $G_m$ boosted common source is amplified by the transistor-2 M2.

The transformer-1 TR1 has a primary coil connected to the emitter of the transistor-2 M2, and has a secondary coil connected to the gate of the transistor-2 M2, and a current which is induced in the secondary coil by the primary coil, in which an emitter current flows, flows into the gate of the transistor-2 M2.

The transistor-1 M1 generates a collector current by amplifying and converting an input voltage, and the transistor-2 M2 amplifies the collector current of the transistor-1 M1 and makes the amplified current flow in the collector.

In this case, the transformer-1 TR1 feeds the emitter current of the transistor-2 M2 back to the gate of the transistor-2 M2, such that $g_m$ of the transistor-2 M2 is boosted according to $G_m=2\ g_m$.

The RF cascode amplification module-1 110 is implemented with low power since the transistor-1 M1 and the transistor-2 M2 share a DC and amplify using only the DC.

Furthermore, the transformer-1 TR1 further increases the gain of the amplifier through $G_m$ boosting.

The RF cascode amplification module-2 120 includes a transistor-3 M3, a transistor-4 M4, and a transformer-2 TR2. A collector of the transistor-3 M3 is connected to an emitter of the transistor-4 M4.

The RF cascode amplification module-2 120 has a modified cascode amplification structure in which a common source is amplified by the transistor-3 M3 and a $G_m$ boosted common source is amplified by the transistor-4 M4.

The transformer-2 TR2 has a primary coil connected to the emitter of the transistor-4 M4, and has a secondary coil connected to the gate of the transistor-4 M4, and a current induced in the secondary coil by the primary coil, in which an emitter current flows, flows into the gate of the transistor-4 M4.

The transistor-3 M3 generates a collector current by receiving a collector voltage of the transistor-2 M2 provided in the RF cascode amplification module-1 110, and amplifying and converting the collector voltage, and the transistor-4 M4 amplifies the collector current of the transistor-3 M3 and makes the amplified current flow in the collector.

In this case, the transformer-2 TR2 feeds the emitter current of the transistor-4 M4 back to the gate of the transistor-4 M4, such that $g_m$ of the transistor-4 M4 is boosted according to $G_m=2\,g_m$.

The RF cascode amplification module-2 120 is implemented with low power since the transistor-3 M3 and the transistor-4 M4 share a DC and amplify using only the DC.

Furthermore, the transformer-2 TR2 further increases the gain of the amplifier through $G_m$ boosting.

Figure 9:
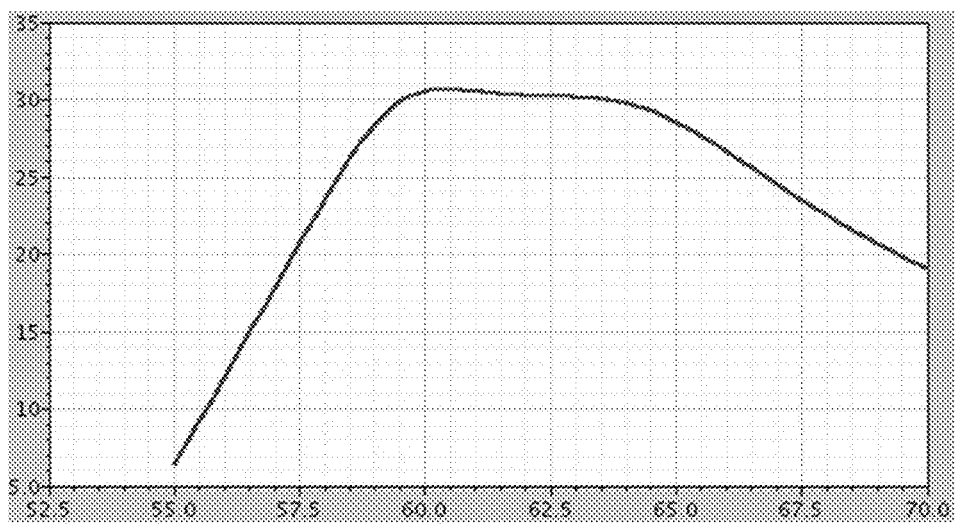
FIG. 9 is a view showing a gain simulation result of the amplifier shown in FIG. 8.

FIG. 9 illustrates a gain simulation result of the amplifier illustrated in FIG. 8. As shown in FIG. 9, the RF cascode amplifier including the two-stage amplification modules as shown in FIG. 8 shows a gain of 32 dB at 60 GHz.

This result corresponds to a gain which can be obtained when the amplifier shown in FIG. 1 is configured by four stages, and it can be seen that the amplifier shown in FIG. 8 ensures that a high gain is obtained at a high frequency with low power.

Up to now, the RF amplifier to increase the gain using the transformer has been described with reference to a preferred embodiment.

In the above-described embodiment, the turns ratio of the primary coil of the transformer to the secondary coil is 1:1. This is to boost the transistor according to $G_m=2\,g_m$. When the boosting ratio of the transistor is to be implemented differently, the turns ratio of the transformer may be set differently.

The RF cascode amplifier according to an exemplary embodiment of the present invention can be applied to a part, a module, and a system for wireless communication, and in particular, can be applied to a part, a module, and a system for other communications as well as a front-end module of 5G mobile communication, which is being prepared as next-generation mobile communication, and a front-end module of next-generation Gbps WiFi, which is high speed WiFi.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An amplifier comprising:
   a first transistor configured to generate a first current by amplifying and converting an input voltage;
   a second transistor configured to generate a second current by amplifying the first current, the second transistor being configured to output the second current through a drain of the second transistor;
   a first transformer configured to feed a current from a source of the second transistor back to a gate of the second transistor;
   a third transistor configured to generate a third current by amplifying and converting a drain voltage of the second transistor generated by the second current;
   a fourth transistor configured to generate a fourth current by amplifying the third current; and
   a second transformer configured to feed a current from a source of the fourth transistor back to a gate of the fourth transistor.

2. The amplifier of claim 1, wherein the first transformer is configured to boost $g_m$ of the second transistor according to $G_m$.

3. The amplifier of claim 2, wherein $G_m=2g_m$.

4. The amplifier of claim 1, wherein the first transformer has a primary coil connected to the source of the second transistor and a secondary coil connected to the gate of the second transistor.

5. The amplifier of claim 4, wherein the secondary coil is configured to apply a current induced by the primary coil to the gate of the second transistor.

6. The amplifier of claim 4, wherein a turns ratio of the primary coil to the second coil is 1:1.

7. A method for amplifying, comprising:
   generating, by a first transistor, a first current by amplifying and converting an input voltage;
   generating, by a second transistor, a second current by amplifying the first current;
   outputting the second current through a drain of the second transistor;
   feeding, by a first transformer, a current from a source of the second transistor back to a gate of the second transistor;
   generating, by a third transistor, a third current by amplifying and converting a drain voltage of the second transistor generated by the second current;
   generating, by a fourth transistor, a fourth current by amplifying the third current; and
   feeding, by a second transformer, a current from a source of the fourth transistor back to a gate of the fourth transistor.

* * * * *